United States Patent
Huang et al.

[11] Patent Number: 6,152,756
[45] Date of Patent: Nov. 28, 2000

[54] IC SOCKET HAVING STANDOFFS

[75] Inventors: Yao-Chi Huang, Yung-Ho; Nick Lin, Hsin-Chuang, both of Taiwan

[73] Assignee: Hon Hai Precision Ind. Co., Ltd., Taipei Hsien, Taiwan

[21] Appl. No.: 09/368,915

[22] Filed: Aug. 5, 1999

[30] Foreign Application Priority Data

Apr. 6, 1999 [TW] Taiwan ................................. 88205240

[51] Int. Cl.[7] ................................................ H01R 13/625
[52] U.S. Cl. ................................................ 439/342; 439/83
[58] Field of Search .......................... 439/342, 259–270, 439/83, 876, 70

[56] References Cited

U.S. PATENT DOCUMENTS 5,658,160  8/1997  Lai .......................................... 439/342
5,730,615  3/1998  Lai et al. ................................. 439/342

Primary Examiner—Gary F. Paumen
Attorney, Agent, or Firm—Wei Te Chung

[57] ABSTRACT

A socket for interconnecting a PGA package with a circuit board comprises a base, a cover slidably attached to the base, and supporting means downwardly extending from the base. The base comprises a pair of extension plates diagonally extending therefrom. The supporting means in the form of a pair of standoffs is formed on the respective extension plates. Since each standoff has a height slightly smaller than that of solder balls formed on a lower surface of the base, the standoffs rest on the circuit board after the socket is soldered thereto. By such a design, the external force employed to actuate the cover to slide along the base is transferred from the base to the standoffs. Hence, deformation of the base and damage to the solder joint are obviated to ensure a reliable connection between the PGA package and the circuit board.

9 Claims, 5 Drawing Sheets

6,152,756

IC SOCKET HAVING STANDOFFS

BACKGROUND OF THE INVENTION

The present invention relates to an IC (integrated circuit) socket for interconnecting with an IC package.

DESCRIPTION OF PRIOR ART

A socket is commonly used for connecting an IC package, such as a PGA package, to a circuit substrate, such as a printed circuit board. An IC socket typically comprises a base retaining a plurality of contacts therein with solder balls affixed thereto and extending beyond a lower surface of the base, and a cover with receiving apertures for receiving corresponding pins of a PGA package. The base is mounted to the circuit substrate by soldering the solder balls to respective solder pads on the circuit substrate to form an electrical connection therebetween. The cover is slidably attached to the base whereby the receiving apertures align with the contacts of the base so that the pins of the PGA package are connected to the respective contacts of the base. Thus, the PGA package is interconnected with the circuit substrate by soldering the solder balls thereto.

However, the IC socket normally has a compact dimension to comply with the miniaturization trend. When the cover of the PGA package slides relative to the base to engage the pins of the IC socket with the contacts of the base, a compressive force acts on the base which may cause deformation thereof and damage the solder balls. Such damage results in improper connection between the PGA package and the circuit substrate. Therefore, an IC socket having supporting means to overcome the aforesaid problem is requisite.

SUMMARY OF THE INVENTION

Accordingly, an object of the present invention is to provide an IC socket having supporting means to resist an external compressive force acting on a base of the socket thereby preventing deformation thereof and damage to solder joints between the socket and a circuit board.

In order to achieve the object set forth, a socket for interconnecting a PGA package to a circuit board in accordance with the present invention comprises a base, a cover slidably attached to the base, and supporting means formed on the base. The base comprises a plurality of receiving holes disposed therethrough for retaining a plurality of contacts therein. Each contact has a solder ball affixed to a free end thereof proximate a lower surface of the base for soldering the assembled socket to the circuit board. The cover comprises a plurality of receiving apertures corresponding to the receiving holes of the base for receiving pins of the PGA package therein. The cover slides along an upper surface of the base when actuated by an external force to connect the pins with the corresponding contacts of the base. Thus, the PGA package is interconnected with the circuit board through the socket soldered thereto.

The base further comprises a pair of extension plates diagonally extending therefrom. The supporting means in the form of a pair of standoffs is formed on the respective extension plates. Since each standoff has a height slightly smaller than that of the solder ball, the standoffs rest on the circuit board after the socket is soldered thereto. By such a design, the external force employed to actuate the cover to slide along the base is transferred from the base to the standoffs. Hence, deformation of the base and damage to the solder joints are obviated to ensure a reliable connection between the PGA package and the circuit board.

Other objects, advantages and novel features of the invention will become more apparent from the following detailed description when taken in conjunction with the accompanying drawings.

DETAILED DESCRIPTION OF THE INVENTION

Figure 1:
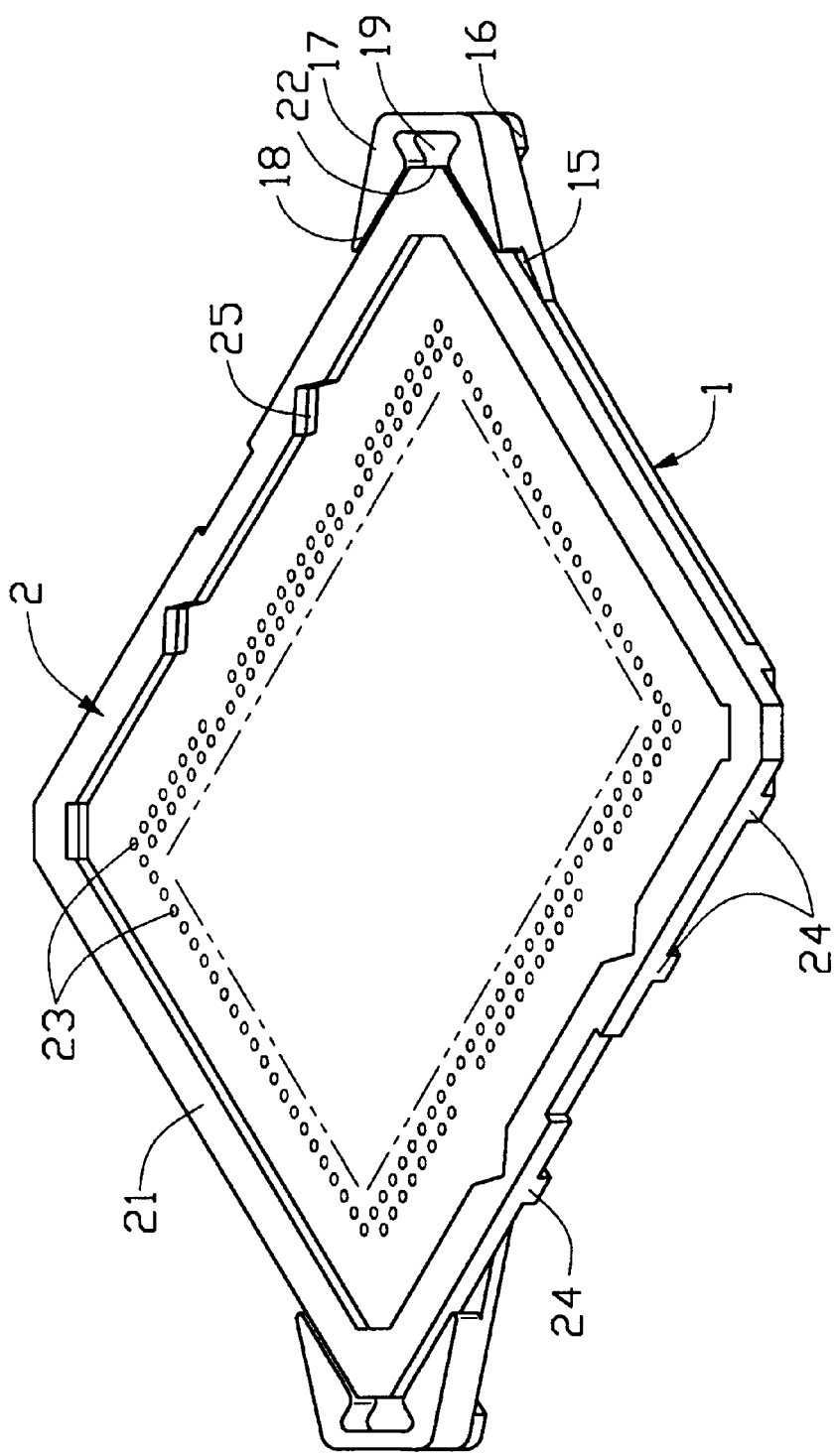
FIG. 1 is a perspective view of an IC socket in accordance with the present invention.
Figure 2:
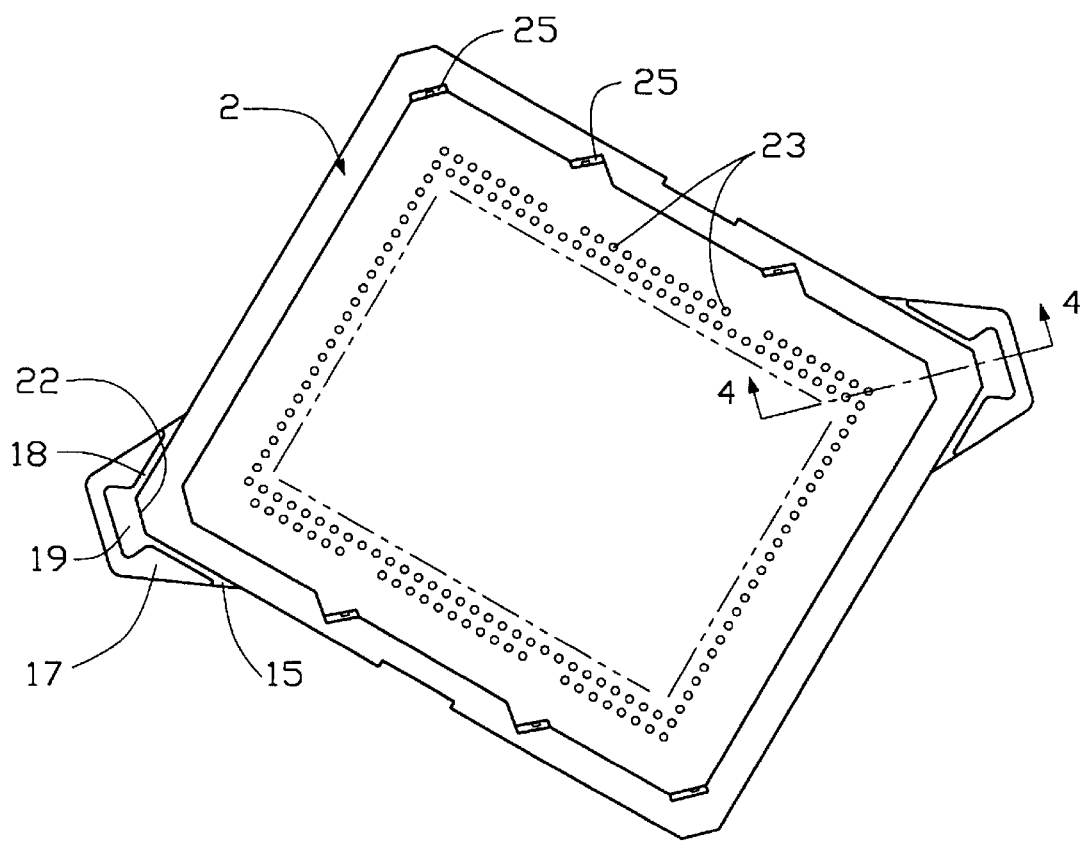
FIG. 2 is a top plan view of FIG. 1.

Referring to FIG. 1, an IC socket in accordance with the present invention is rectangular. The socket comprises a base 1 and a cover 2 slidably attached to the base 1. Four peripheral walls 21 with chamfered corners 22 formed therebetween extend around a body of the cover 2 to define a receiving cavity (not labeled) for receiving a PGA, package (not shown) therein. A plurality of receiving apertures 23 arranged in rows and columns is disposed through the body of the cover 2 for receiving corresponding pins extending from a lower surface of the PGA package therein.

Figure 3:
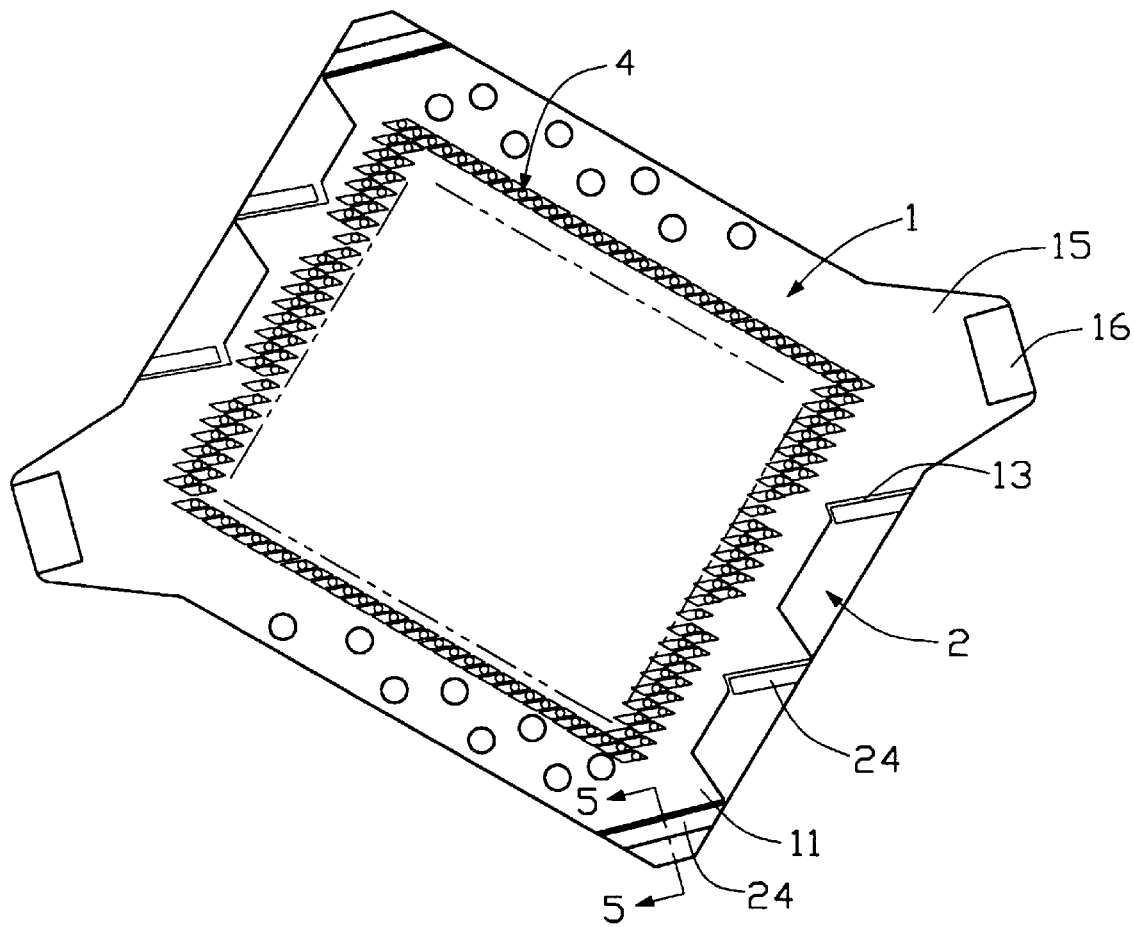
FIG. 3 is a bottom plan view of FIG. 1.
Figure 5:
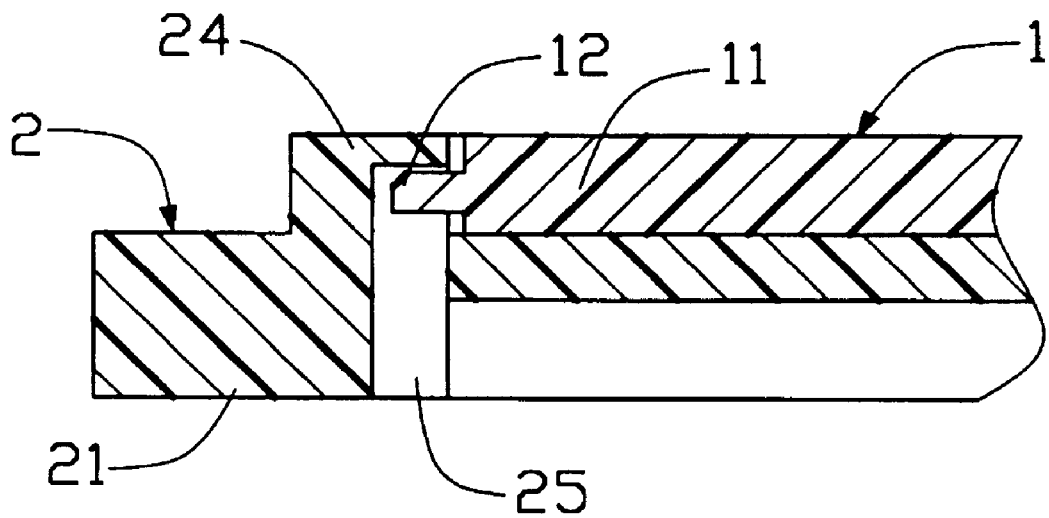
FIG. 5 is a cross-sectional view taken along line 5—5 of FIG. 3.

Also referring to FIGS. 3 and 5, a plurality of engaging legs 24 integrally extends from two opposite sides of the cover 2. An engaging channel 25 is defined in each engaging leg 24 through the body of the cover 2 in communication with the receiving cavity.

The base 1 comprises a plurality of triangular protrusions 11 extending from two opposite sides thereof. A substantially U-shaped engaging cut 13 is formed proximate each protrusion 11 for receiving the corresponding engaging leg 24 of the cover 2 therein. Each protrusion 11 further comprises a tongue 12 (FIG. 5) extending therefrom and into a corresponding engaging channel 25. Thus, the cover 2 is slidably attached to the base 1 which will be described in detail hereafter.

Figure 4:
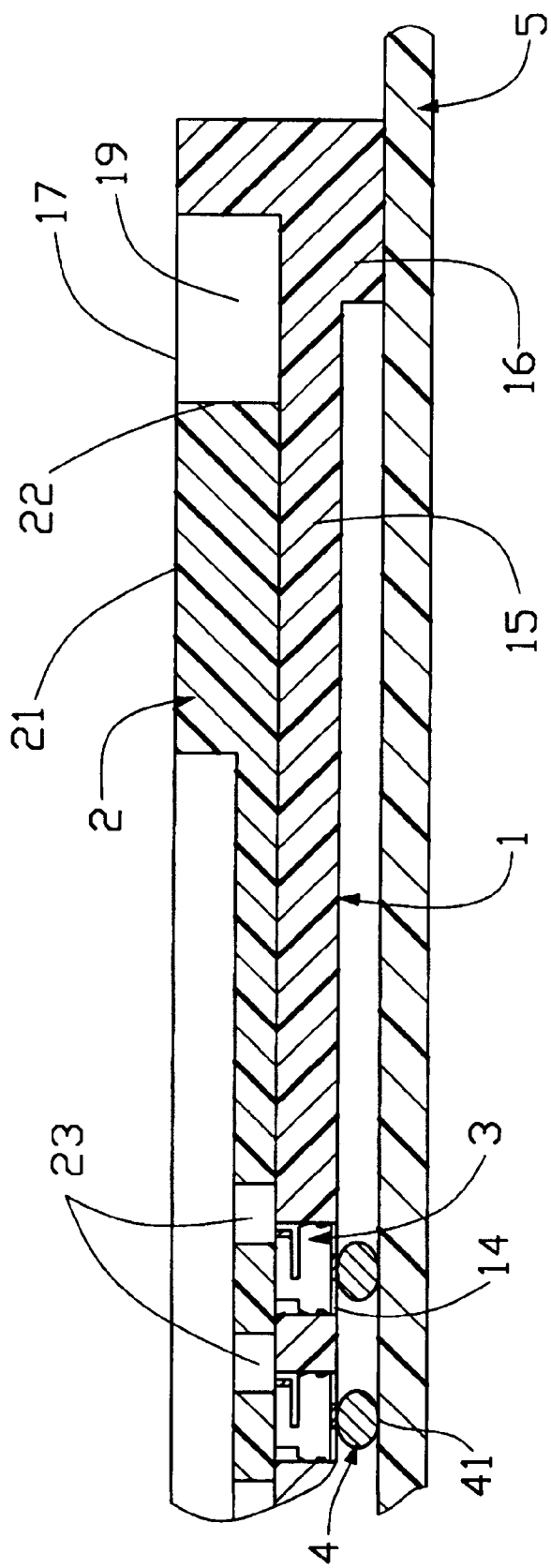
FIG. 4 is a cross-sectional view taken along line 4—4 of FIG. 2.

A plurality of receiving slots 14 arranged in rows and columns corresponding to the receiving apertures 23 of the cover 2 is disposed through the base 1 as shown in FIG. 4. A plurality of contacts 3 is retained in the corresponding slots 14 each having a solder ball 4 affixed to a terminal end thereof. Each solder ball 4 has a solder surface 41 distanced from a bottom surface of the base 1 for being soldered to a solder pad (not shown) of a circuit board 5 thereby connecting the socket thereto. Supporting means is formed between the lower surface of the base 1 and the solder surface 41 of the solder ball 4.

The base 1 further comprises a pair of extension plates 15 diagonally extending therefrom. A U-shaped retention section 17 is formed on an upper surface of each extension plate 15 with a substantially V-shaped groove 18 disposed therein for receiving the corresponding chamfered corner 22 of the cover 2. A substantially U-shaped opening 19, i.e., an actuation section, is formed in communication with the groove 18 for receiving an external tool, such as a screw driver, to actuate the cover 2 to slide along an upper surface of the base 1.

The supporting means is in the form of a pair of standoffs 16 downwardly extending from the extension plates 15. Each standoff 16 has a height slightly smaller than that of the solder ball 4. It should be noted that the supporting means can be made from dielectric material or metal material and can be formed integrally with or separate from the cover 2.

Referring back to FIGS. 3 and 5, the legs 24 of the cover 2 are retained between the corresponding protrusions 11 and the adjacent cuts 13 by retaining the tongues 12 of the protrusions 11 in the corresponding engaging channels 25. Since the length of the tongue 12 is smaller than the width of the channel 25, the tongue 12 can move within the corresponding channel 25 thereby slidably attaching the cover 2 to the base 1.

As shown in FIG. 4, the assembled socket is then connected to the circuit board 5 by soldering the solder balls 4 thereto. The height of the solder ball 4 is decreased after being soldered. Since the height of the standoffs 16 is slightly smaller than that of the solder balls 4 before being soldered, the standoffs 16 rest on an upper surface of the circuit board after the solder balls 4 are soldered thereto. When connecting the PGA package to the socket, the pins formed on the lower surface thereof are first received in the corresponding receiving apertures 23 of the cover 2 thereby retaining the PGA package in the receiving cavity. The cover 2 is then actuated to move relative to the base 1 to align the receiving apertures 23 thereof with the corresponding slots 14 of the base 1 having the contacts 3 retained therein. The external tool is inserted into the opening 19 to actuate the cover 2 to move relative to the base 1. An external force thereby acts on the chamfered corner 22 retained in the corresponding groove 18 of the extension plate 15. Thus, the receiving apertures 23 of the cover 2 are moved into alignment with the corresponding slots 14 of the base 1 thereby connecting the pins of the PGA package to the corresponding contacts 3 of the base 1.

During the assembly process as described above, an external compressive force acts on the base 1 which may cause deformation thereto and damage the solder joints. Since the standoffs 16 support the base 1 on the circuit board 5, the external compressive force is transferred from the base 1 to the standoffs 16. Hence, deformation of the base 1 and damage to the solder balls 4 caused by the external compressive force are obviated to ensure reliable connection between the PGA package and the circuit board 5.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad substantially meaning of the terms in which the appended claims are expressed.

We claim:

1. A socket for interconnecting a pin grid array package having a plurality of pins to a circuit board, comprising:

a base forming an upper surface, a lower surface, and a plurality of slots arranged in rows and columns between the upper and lower surfaces;

a cover slidably mounted to the base, the cover comprising a plurality of apertures disposed therethrough for receiving corresponding pins of the pin grid array package and arranged in rows and columns corresponding to the slots of the base;

a plurality of contacts received in corresponding slots of the base, each contact having a free end proximate the lower surface of the base;

a plurality of solder balls correspondingly affixed to the free ends of the contacts, each solder ball having a solder surface for being soldered to the circuit board; and a pair of standoffs disposed on the lower surface of the base near a respective position where an external force for moving the cover relative to the base is applied, each standoff having a bottom face abutting against the circuit board when the external force is applied;

wherein the base comprises a pair of extension plates diagonally extending therefrom, each extension plate forming a V-shaped groove in an upper surface thereof and an opening in communication with the V-shaped groove for receiving an external tool, whereby when the external tool slidably moves the cover relative to the base, the pins are moved into engagement with the contacts.

2. The socket as described in claim 1, wherein the cover comprises four chamfered corners, a pair of diagonal corners of the four chamfered corners being retained in the corresponding V-shaped grooves of the extension plates.

3. The socket as described in claim 1, wherein the pair of standoffs is formed on bottom surfaces of the extension plates.

4. The socket as described in claim 3, wherein each standoff is integrally formed with the corresponding extension plate.

5. The socket as described in claim 3, wherein each standoff is separate from the corresponding extension plate.

6. The socket as described in claim 3, wherein the standoffs have a height slightly smaller than that of the solder balls.

7. The socket as described in claim 1, wherein the cover comprises a plurality of engaging legs integrally extending from two opposite sides thereof, and an engaging channel is defined in each leg and extends upward through the cover.

8. The socket as described in claim 7, wherein the base comprises a plurality of triangular protrusions extending from opposite sides thereof and a plurality of cuts formed proximate the corresponding protrusions for receiving the engaging legs of the cover.

9. The socket as described in claim 8 wherein each protrusion comprises a tongue extending therefrom into the adjacent cut and the engaging channel of the corresponding engaging leg of the cover.

* * * * *